United States Patent
Fogleman et al.

(10) Patent No.: US 10,003,347 B2
(45) Date of Patent: *Jun. 19, 2018

(54) METHOD AND SYSTEM FOR ASYNCHRONOUS SUCCESSIVE APPROXIMATION REGISTER (SAR) ANALOG-TO-DIGITAL CONVERTERS (ADCS)

(71) Applicant: Maxlinear, Inc., Carlsbad, CA (US)

(72) Inventors: Eric Fogleman, San Marcos, CA (US); Sheng Ye, Carlsbad, CA (US); Xuefeng Chen, Carlsbad, CA (US); Kok Lim Chan, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/711,177

(22) Filed: Sep. 21, 2017

(65) Prior Publication Data
US 2018/0013442 A1 Jan. 11, 2018

Related U.S. Application Data

(63) Continuation of application No. 15/230,735, filed on Aug. 8, 2016, now Pat. No. 9,800,253, which is a continuation of application No. 14/843,445, filed on Sep. 2, 2015, now Pat. No. 9,413,378, which is a continuation of application No. 14/585,656, filed on Dec. 30, 2014, now Pat. No. 9,136,859, which is a continuation of application No. 13/964,043, filed on Aug. 10, 2013, now Pat. No. 8,922,415.

(60) Provisional application No. 61/681,828, filed on Aug. 10, 2012.

(51) Int. Cl.
*H03M 1/00* (2006.01)
*H03M 1/06* (2006.01)

(52) U.S. Cl.
CPC ......... *H03M 1/0617* (2013.01); *H03M 1/001* (2013.01)

(58) Field of Classification Search
CPC ............................ H03M 1/0617; H03M 1/001
USPC .................................................. 341/110–155
See application file for complete search history.

(56) References Cited

U.S. PATENT DOCUMENTS

| | | |
|---|---|---|
| 4,730,110 A | 3/1988 | Spaulding |
| 4,733,220 A | 3/1988 | Knierim |
| 6,228,937 B1 | 5/2001 | Eck et al. |

(Continued)

*Primary Examiner* — Lam T Mai
(74) *Attorney, Agent, or Firm* — McAndrews, Held & Malloy, Ltd.

(57) ABSTRACT

An asynchronous successive approximation register analog-to-digital converter (SAR ADC), which utilizes one or more overlapping redundant bits in each digital-to-analog converter (DAC) code word, is operable to generate an indication signal that indicates completion of each comparison step and indicates that an output decision for each comparison step is valid. A timer may be initiated based on the generated indication signal. A timeout signal may be generated that preempts the indication signal and forces a preemptive decision, where the preemptive decision sets one or more remaining bits up to, but not including, the one or more overlapping redundant bits in a corresponding digital-to-analog converter code word for a current comparison step to a particular value. For example, the one or more remaining bits may be set to a value that is derived from a value of a bit that was determined in an immediately preceding decision.

20 Claims, 8 Drawing Sheets

(56) References Cited

U.S. PATENT DOCUMENTS

| | | |
|---|---|---|
| 6,369,737 B1 | 4/2002 | Yang et al. |
| 7,356,789 B2 | 4/2008 | Ly et al. |
| 7,630,464 B1 | 12/2009 | Deboes et al. |
| 8,134,487 B2 | 3/2012 | Harpe |
| 8,193,957 B2 | 6/2012 | Yoshioka |
| 8,199,043 B2 | 6/2012 | Van der Plas et al. |
| 8,362,940 B2 | 1/2013 | Yoshioka |
| 8,416,116 B2 | 4/2013 | Chang et al. |
| 8,482,449 B1 | 7/2013 | Zabroda |
| 8,669,897 B1 | 3/2014 | Chen et al. |
| 8,786,483 B1 | 7/2014 | Thompson et al. |
| 8,922,415 B2 * | 12/2014 | Fogleman ............. H03M 1/462 341/160 |
| 9,136,859 B2 * | 9/2015 | Fogleman ............. H03M 1/462 |
| 9,413,378 B2 * | 8/2016 | Fogleman ............. H03M 1/462 |
| 2014/0320716 A1 | 10/2014 | Huang |
| 2015/0008308 A1 | 1/2015 | Huang et al. |

* cited by examiner

METHOD AND SYSTEM FOR ASYNCHRONOUS SUCCESSIVE APPROXIMATION REGISTER (SAR) ANALOG-TO-DIGITAL CONVERTERS (ADCS)

CROSS-REFERENCE TO RELATED APPLICATIONS/INCORPORATION BY REFERENCE

This patent application is a continuation of U.S. patent application Ser. No. 15/230,735, filed Aug. 8, 2016, which is a continuation of U.S. patent application Ser. No. 14/843,445, filed Sep. 2, 2015 (now U.S. Pat. No. 9,413,378), which is a continuation of U.S. patent application Ser. No. 14/585,656, filed Dec. 30, 2014 (now U.S. Pat. No. 9,136,859), which is a continuation of U.S. patent application Ser. No. 13/964,043, filed Aug. 10, 2013 (now U.S. Pat. No. 8,922,415), which in turn makes reference to, claims priority to and claims benefit from the U.S. Provisional Patent Application Ser. No. 61/681,828, filed Aug. 10, 2012.

This application also makes reference to: U.S. application Ser. No. 13/945,579 Jul. 18, 2013 (now U.S. Pat. No. 9,124,291), which claims priority to U.S. Application Ser. No. 61/673,219, which was filed on Jul. 18, 2012; and U.S. Application Ser. No. 61/673,219, which was filed on Jul. 18, 2012.

Each of the above stated applications is hereby incorporated herein by reference in its entirety.

FIELD OF THE INVENTION

Certain embodiments of the invention relate to analog-to-digital circuits. More specifically, certain embodiments of the invention relate to a method and system for asynchronous successive approximation register (SAR) analog-to-digital converters (ADCs).

BACKGROUND OF THE INVENTION

Successive approximation register (SAR) analog-to-digital converters (ADCs) may achieve high resolution but are limited in the speed they can achieve. Two components that limit the speed of asynchronous successive approximation register analog-to-digital converters are (1) the settling time of a digital-to-analog converter (DAC) that is utilized by the ADC, and (2) the metastability of the comparator that is utilized by the ADC.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for asynchronous successive approximation register analog-to-digital converters, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for asynchronous successive approximation register (SAR) analog-to-digital converters (ADCs). In various exemplary embodiments of the invention, the asynchronous SAR ADC, which utilizes one or more overlapping redundant bits in each digital-to-analog converter (DAC) code word, is operable to generate an indication signal that indicates completion of each comparison step and indicates that an output decision for each comparison step is valid. A timer in the asynchronous SAR ADC may be initiated based on the generated indication signal. A timeout signal may be generated that preempts the indication signal and forces a preemptive decision. The preemptive decision causes one or more remaining bits up to, but not including, the one or more overlapping redundant bits in a corresponding digital-to-analog converter code word for a current comparison step to be set to a particular value. In an exemplary embodiment of the invention, the one or more remaining bits up to, but not including, the one or more overlapping redundant bits in the corresponding digital-to-analog converter code word for the current comparison step may be set to a value derived from a value of a bit that was determined in an immediately preceding decision.

The timeout signal may be generated based on a dynamically and/or adaptively determined threshold time. The determined threshold time may be determined so that it guarantees that a magnitude of a difference between an analog input voltage to the asynchronous SAR ADC and an analog output DAC voltage is within an overlapping range of voltages corresponding to the one or more overlapping redundant bits. For each comparison step, an analog input voltage to the asynchronous SAR ADC may be compared to an analog output digital-to-analog converter voltage. A corresponding comparing time for each comparison step may be mapped to the difference between the analog input voltage to the asynchronous SAR ADC and the analog output DAC voltage. Results from the mapping may be calibrated based on process, temperature and/or the analog input voltage to the asynchronous SAR ADC variations. The results from the mapping and results from the calibrating may be stored, for example, in a look-up-table. A particular value for a next bit may be inferred if the corresponding comparing time for each comparison step exceeds a particular time, which provides an indication that a magnitude of a difference between the analog input voltage to the asynchronous SAR ADC and the analog output DAC voltage is less than a fractional portion of a current step size of a DAC that generates the analog output DAC voltage. Exemplary fractional portions may comprise ½, ¼, ⅛, 1/16, 1/32 and so on.

Figure 1:
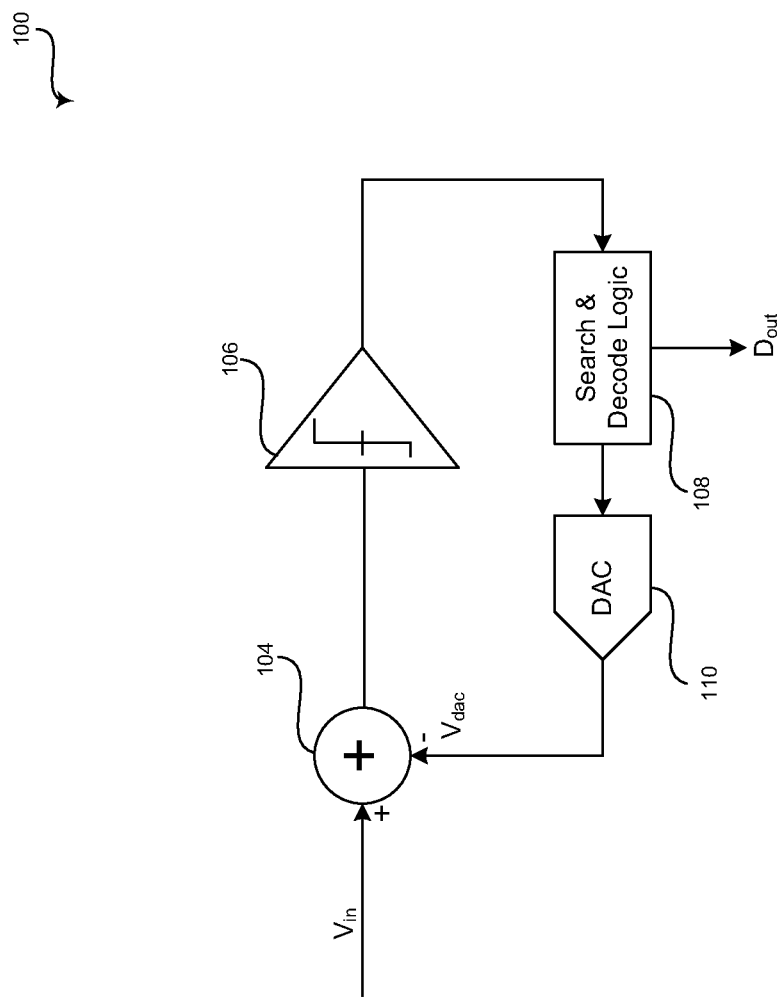
FIG. 1 is a block diagram illustrating a successive approximation register ADC, in connection with various exemplary aspects of the invention.

FIG. 1 is a block diagram illustrating a successive approximation register ADC, in connection with various exemplary aspects of the invention. Referring to FIG. 1, there is shown a successive approximation register ADC 100 comprising a summer 104, a comparator 106, a search and decode logic module 108 and a digital-to-analog converter (DAC) 110.

The summer 104 may comprise suitable logic, circuitry and/or interfaces that may be operable to sum the input analog voltage, $V_{in}$, with the output analog voltage, $V_{dac}$, generated from the DAC 110 in order to determine a difference between the input analog voltage, $V_{in}$ and the output analog voltage, $V_{dac}$. The resulting output from the summer 104, which is based on the difference, between the input analog voltage, $V_{in}$ and the output analog voltage, $V_{dac}$ may be communicated to the comparator 106. The summer 104 may comprise an analog voltage summer.

The comparator 106 may comprise suitable logic, circuitry, interfaces and/or code that may be operable to generate an output signal or code based on the output signal that is generated by the summer 104. In this regard, the comparator 106 may be operable to generate an output signal or code that is representative of the difference, between the input analog voltage, $V_{in}$ and the output analog voltage, $V_{dac}$. The comparator 106 may comprise an analog voltage comparator.

The search and decode logic module 108 may comprise suitable logic, circuitry, interfaces and/or code that may be operable to perform a binary search of the bits and accordingly generate a resulting code word based on the output signal or code from the comparator 106. In this regard, the search and decode logic module 108 may be operable to search for a code that produces an analog voltage, $V_{dac}$, from the DAC 110, which best approximates the voltage $V_{in}$. The search and decode logic module 108 may comprise a binary search and decode circuitry.

The DAC 110 may comprise suitable logic, circuitry, interfaces and/or code that may be operable to generate the analog voltage, $V_{dac}$, based on the resulting code word generated by the search and decode logic module 108. The analog voltage, $V_{dac}$, may be communicated to the summer 104.

In operation, the summer 104 is operable to sum the input analog voltage, $V_{in}$, with the output analog voltage produced by a DAC 110 and accordingly generate a signal or code that may be representative of the difference between the input analog voltage, $V_{in}$ and the output analog voltage, $V_{dac}$. The comparator 106 may be operable to generate an output signal based on the difference between the input analog voltage, $V_{in}$ and the output analog voltage, $V_{dac}$. The search and decode logic module 108 may be operable to perform a binary search of the bits and accordingly generate a resulting code word based on the output signal from the comparator 106. In this regard, the search and decode logic module 108 may be operable to search for the code that produces a DAC voltage that may be closest to the input analog voltage, $V_{in}$. During the searching, time is allocated to allow the output analog voltage, $V_{DAC}$, of the DAC 110 to settle followed by time required to compare the output analog voltage, $V_{dac}$, with the input analog voltage, $V_{in}$. In general, the maximum settling time for a DAC may be dependent on the settling time of the most significant bit (MSB).

Figure 2:
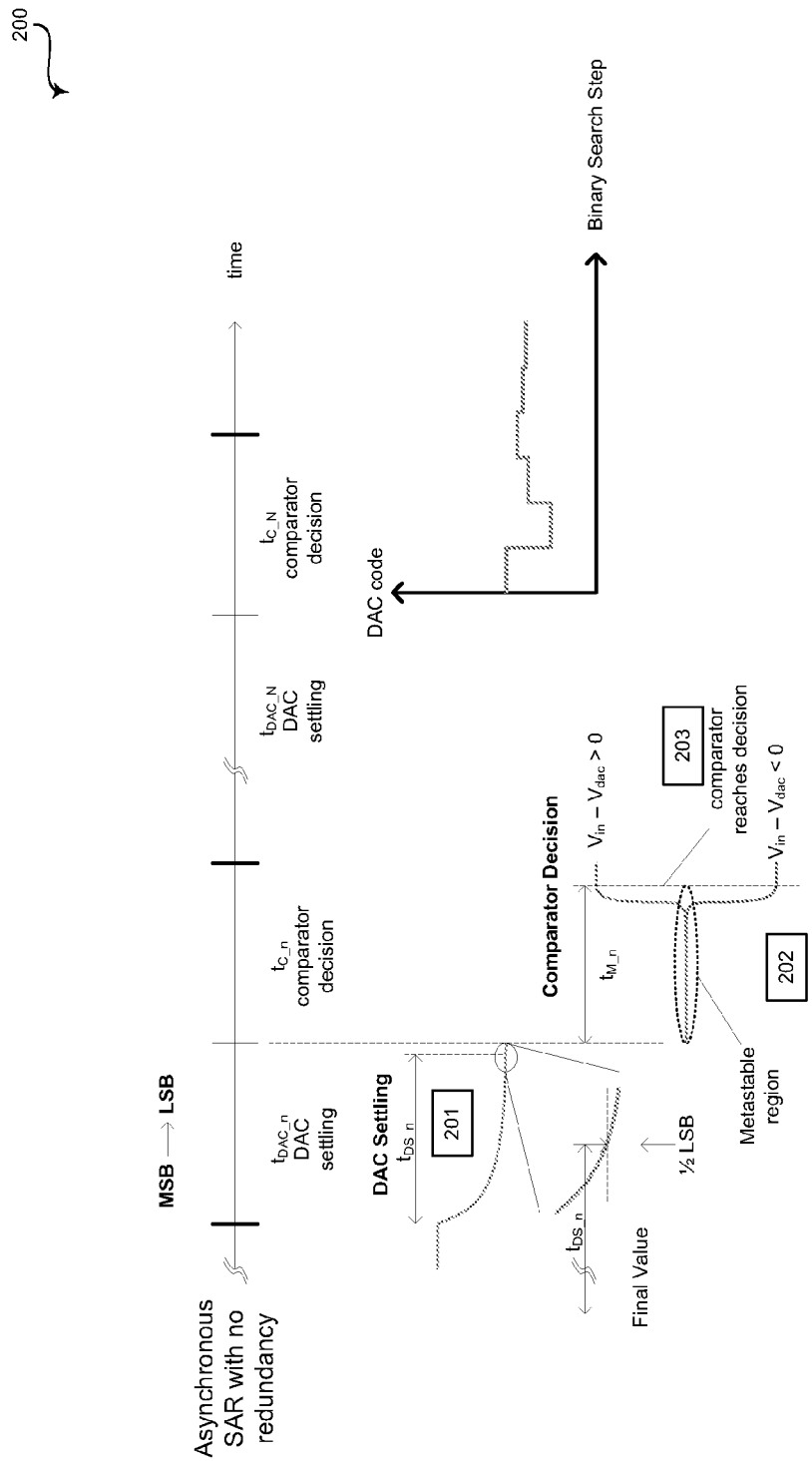
FIG. 2 is a block diagram illustrating operation of an asynchronous successive approximation register ADC, in connection with various exemplary aspects of the invention.

FIG. 2 is a block diagram illustrating operation of an asynchronous successive approximation register ADC, in connection with various exemplary aspects of the invention. Referring to FIG. 2, there is shown a timeline 200 of the operation of an asynchronous successive approximation register ADC without redundancy. The time allocated for the output analog voltage, $V_{DAC}$, of the DAC 110 to settle may be referenced as $t_{DAC\_n}$. The time period 201 illustrates an exemplary time period, $t_{DS\_n}$, during which the DAC 110 settles. The time allocated for the comparator 106 to compare and determine the value output from the summer 104 may be referenced as $t_{C\_n}$. The output from the summer 104 is the difference between the input analog voltage, $V_{in}$, and the output of the analog voltage, $V_{dac}$, of the DAC 110. The time period 202 illustrates an exemplary period, $t_{M\_n}$, during which the comparator 106 compares the output from the summer 104, which is the difference between the analog voltage, $V_{dac}$, and the input analog voltage, $V_{in}$. At the end of the time period, $t_{M\_n}$, the comparator 106 makes a decision.

The successive approximation register ADC 100, which is illustrated in FIG. 1, relies on an asynchronous approach, which allocates a predetermined amount of time, $t_{DAC\_n}$, for the analog voltage, $V_{dac}$, of the DAC 110 to settle and a predetermined amount of time, $t_{C\_n}$, for the difference of output analog voltage, $V_{dac}$, of the DAC 110 and the input analog voltage, $V_{in}$, $t_{C\_n}$ to be determined by the comparator 106. Additionally, the successive approximation register ADC 100, which utilizes N bits, typically require N steps in order to quantize the input analog voltage, $V_{in}$. Each of the N steps involves a time period given by the sum of $t_{DAC\_n}$ and $t_{C\_n}$. Furthermore, both $t_{DAC\_n}$ and $t_{C\_n}$ are set to accommodate various worst-case scenarios. For example, $t_{DAC\_n}$ and $t_{C\_n}$ are set in order to allow the DAC 110 to settle to within one lowest significant bit (LSB) of the input analog voltage, $V_{in}$, or a wrong decision will be made in the binary search algorithm. In another example, since the input to the comparator 106 may be very small (close to zero), this may result in a "meta-stable" condition where the comparator 106 takes an inordinately long time to settle. If the time $t_{M\_n}$ exceeds the allocated time $t_{C\_n}$, then an erroneous decision may be made in the binary search that is executed by the search and decode logic module 108. In order to address incomplete DAC settling, the DAC 110 may be operable to utilize overlapping DAC ranges, which are also referred to as redundancy. The redundancy maps a particular voltage to more than one DAC code word or value by designating one or more bits to have a redundant weighting to cover overlapping ranges of voltages. This allows the worst-case DAC settling time to be reduced so that the DAC is forced to settle to within the overlapping range. Additional information on the meta-stable condition and meta-stable detection may be found in U.S. application Ser. No. 13/945, 579 Jul. 18, 2013, which is hereby incorporated herein by reference in its entirety.

Figure 3:
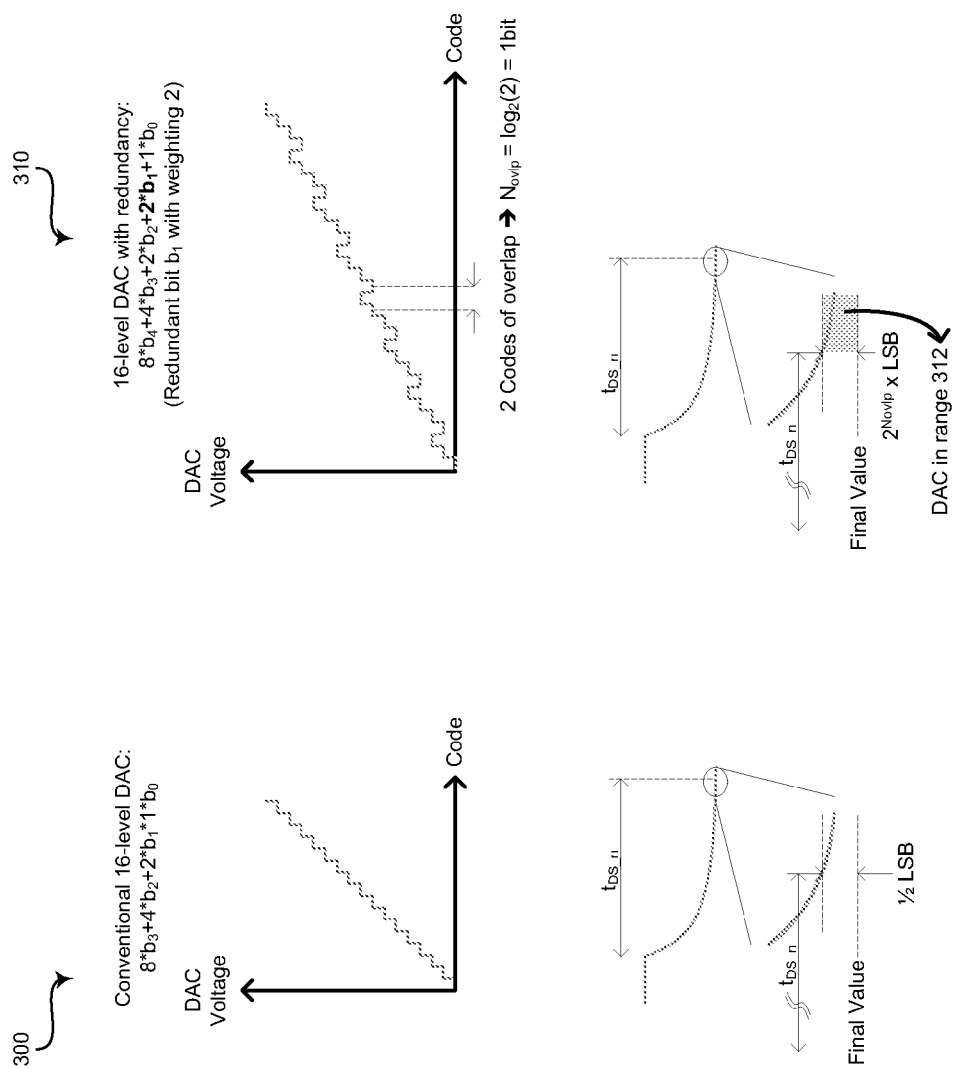
FIG. 3 is a diagram that illustrates DAC redundancy and its effect on DAC settling time for bit n, tDS_n, in connection with various exemplary aspects of the invention.

FIG. 3 is a diagram that illustrates DAC redundancy and its effect on DAC settling time for bit n, $t_{DS\_n}$, in connection with various exemplary aspects of the invention. Referring to FIG. 3, there is shown a graph 300 of a conventional 16-level DAC without redundancy and a graph 310 of a 16-level DAC with redundancy.

Referring to the graph 300 of the conventional 16-level DAC without redundancy, at the end of the time period, $t_{DS\_n}$, during which the DAC 110 settles, the final value of the DAC is ½ the LSB.

Referring to the graph 310 of the conventional 16-level DAC 110 with redundancy, there is shown a redundancy of 2 overlapping codes introduced by a redundant DAC weighting of 2 at bit b1. The overlapping range of voltages allows the DAC 110 additional range (DAC in range 312) in which to settle.

Figure 4:
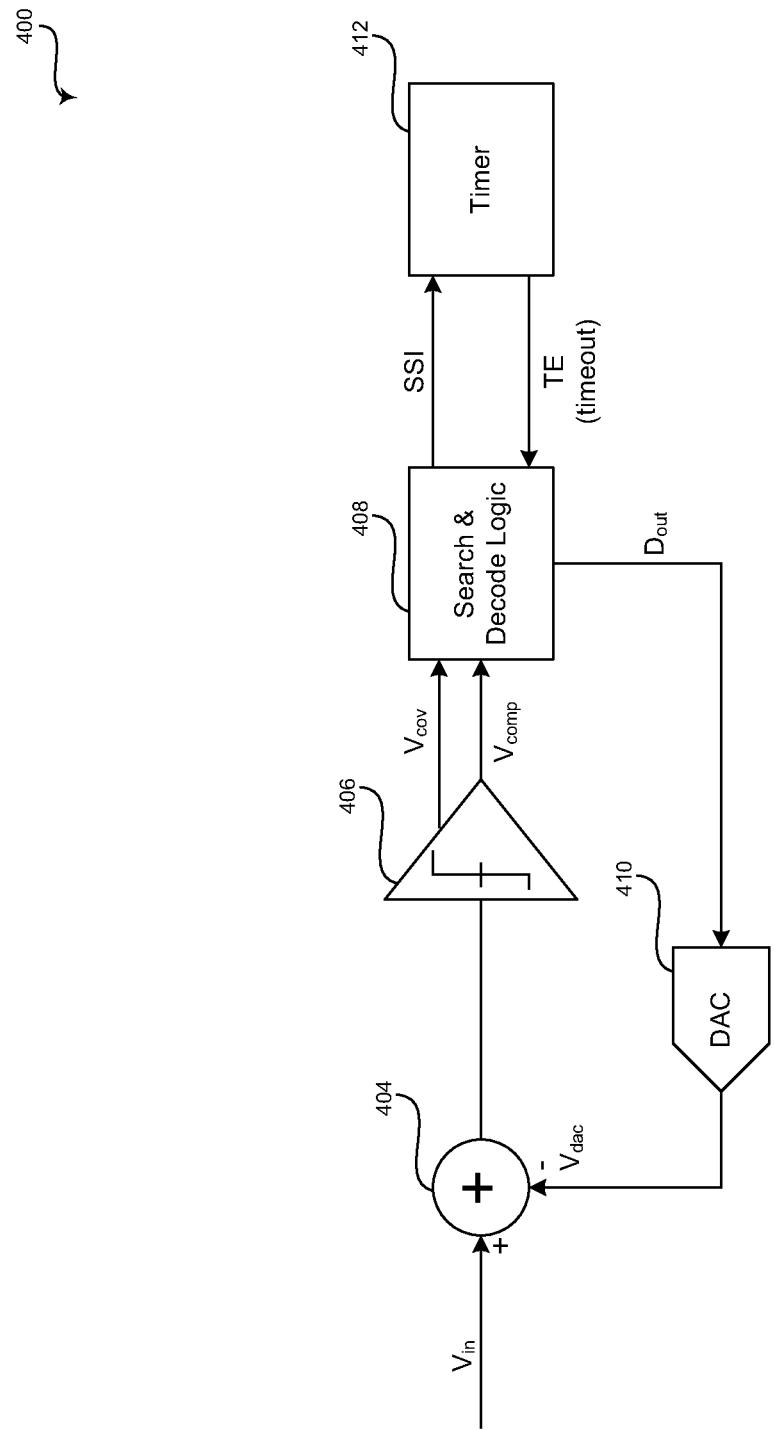
FIG. 4 is a block diagram of an exemplary asynchronous successive approximation register ADC, in accordance with an exemplary embodiment of the invention.

FIG. 4 is a block diagram of an exemplary asynchronous successive approximation register ADC, in accordance with an exemplary embodiment of the invention. Referring to FIG. 4, there is shown an asynchronous successive approximation register ADC 400 comprising a summer 404, a comparator 406, a search and decode logic module 408, a digital-to-analog converter (DAC) 410 and a timer module 412.

The summer 404 may comprise suitable logic, circuitry and/or interfaces that may be operable to sum the input analog voltage, $V_{in}$, with the output analog voltage, $V_{dac}$, generated from the DAC 410 in order to determine a difference between the input analog voltage, $V_{in}$ and the output analog voltage, $V_{dac}$. The resulting output from the summer 404, which is based on the difference, between the input analog voltage, $V_{in}$ and the output analog voltage, $V_{dac}$ may be communicated to the comparator 406. The summer 404 may comprise an analog voltage summer.

The comparator 406 may comprise suitable logic, circuitry, interfaces and/or code that may be operable to generate a comparator output voltage signal or code, $V_{comp}$, based on the output signal that is generated by the summer 404. In this regard, the comparator 406 may be operable to generate a comparator output voltage signal or code, $V_{comp}$, that is representative of the difference, between the input analog voltage, $V_{in}$ and the output analog voltage, $V_{dac}$. The comparator 406 may comprise an analog voltage comparator. The comparator 406 may also be operable to generate a comparator output valid signal, $V_{cov}$, which indicates the completion of each step. The comparator output valid signal, $V_{cov}$, is operable to provide an indication that the comparator 406 has made a decision. The comparator output valid signal is utilized to control and provide asynchronous timing within the asynchronous successive approximation register ADC 400. In this regard, the start of each step in the asynchronous successive approximation register ADC 400 is triggered by the completion of the previous step.

The search and decode logic module 408 may comprise suitable logic, circuitry, interfaces and/or code that may be operable to perform a binary search of the bits and accordingly generate a resulting code word, $D_{out}$, based on the output signal or code from the comparator 406. The operation of the search and decode logic module 408 may be triggered by the comparator output valid signal, $V_{cov}$, when the comparator output valid signal, $V_{cov}$, is active. In this regard, the search and decode logic module 408 may be operable to search for a code that produces an analog voltage, $V_{dac}$, from the DAC 410, which best approximates the voltage $V_{in}$. The search and decode logic module 408 may comprise a binary search and decode circuitry. In some embodiments of the invention, a timer elapsed or timeout signal is generated by the timer module 412, this may preempt the comparator output valid signal, $V_{cov}$. In instances when the timer elapsed or timeout signal preempts the comparator output valid signal, $V_{cov}$, this may force a preemptive decision.

The DAC 410 may comprise suitable logic, circuitry, interfaces and/or code that may be operable to generate the analog voltage, $V_{dac}$, based on the resulting code word, $D_{out}$, generated by the search and decode logic module 408. The analog voltage, $V_{dac}$, which is generated by the DAC 410 may be communicated to the summer 404.

The timer module 412 may comprise suitable logic, circuitry, interfaces and/or code that may be operable to generate a timer elapsed (TE) signal or a timeout, which may be operable to force the search and decode logic module 408 to trigger a preemptive decision. The timer module 412 may be operable to measure and/or estimate the actual time of each comparator step, $t_{M\_n}$, in order to trigger the preemptive decision. In accordance with various embodiments of the invention, the triggering of the preemptive decision may result in one or more (including all) of the remaining code word bits being set to a particular value based on the time the timer module 412 determines is required or has taken or the comparator 406 to arrive at a decision. In some embodiments of the invention, the timer module 412 may be operable to generate a timeout signal that may preempt the comparator output valid signal, $V_{cov}$, which may be generated by the comparator 406. In instances when the timer module 412 generates the timer elapsed or timeout signal, the timer elapsed or timeout signal preempts the comparator output valid signal, $V_{cov}$, and forces the preemptive decision.

In operation, the summer 404 is operable to sum the input analog voltage, $V_{in}$, with the output analog voltage produced by a DAC 410 and accordingly generate a signal or code that may be representative of the difference between the input analog voltage, $V_{in}$ and the output analog voltage, $V_{dac}$. The comparator 406 may be operable to generate the comparator output voltage signal or code, $V_{comp}$, and the comparator output valid signal, $V_{cov}$, based on the difference between the input analog voltage, $V_{in}$ and the output analog voltage, $V_{dac}$. The comparator 406 may be operable to generate the comparator output valid signal, $V_{cov}$, in order to provide an indication that the comparator 406 has made a decision and that the comparator output voltage signal or code, $V_{comp}$, is a valid output of the comparator 406. The generation of the comparator output voltage signal or code, $V_{comp}$, also provides asynchronous timing within the asynchronous successive approximation register ADC 400.

The search and decode logic module 408 may be triggered upon receipt of the comparator output valid signal, $V_{cov}$, which is generated by the comparator 406. The search and decode logic module 408 may be operable to generate a start signal indicator (SSI) that starts the timer module 412. The search and decode logic module 408 may be operable to perform a binary search of the bits and accordingly generate a resulting code word based on the output signal from the comparator 406 based on the comparator output voltage signal or code, $V_{comp}$, and the comparator output valid signal, $V_{cov}$, which are generated by the comparator 406. In this regard, the search and decode logic module 408 may be operable to search for the code that produces a DAC voltage that may be closest to the input analog voltage, $V_{in}$.

The timer module 412 may be operable to generate a timer elapsed signal, TE, after a certain time period has elapsed. The generated timer elapsed signal, TE, may be communicated from the timer module 412 to the search and decode logic module 408. Upon receipt of the generated timer elapsed signal, TE, or timeout signal from the timer module 412, the search and decode logic module 408 may be operable to trigger a pre-emptive decision. The search and decode logic module 408 may be operable to generate an output signal, Dout, which comprises a code word.

The timer module 412 may comprise, for example, a ring oscillator operating at a relatively precise frequency, whose state is decoded to indicate a periodic time. In an alternate embodiment of the invention, the timer module 412 may comprise a counter that may be driven by, for example, a voltage controlled oscillator (VCO) and/or by one or more by one or more prescalers driven by the voltage controlled oscillator. The voltage controlled oscillator may be a dedicated VCO or may be one that is utilized in a reference synthesizer or radio frequency (RF) synthesizer that may already be present on a chip (i.e. one used for the RF signal path or a serializer/deserializer (SERDES) interface), in which the asynchronous successive approximation register ADC 400 may be utilized.

As utilized herein, the asynchronous timing that is utilized by the asynchronous successive approximation register ADC 400 means that the time allocated for each step of the binary search that is executed by the search and decode logic module 408 is variable. In this regard, the DAC settling time, $t_{DS\_n}$, and the comparator decision time, time $t_{M\_n}$, are variable. In this regard, the DAC settling time, $t_{DS\_n}$, and the comparator decision time, time $t_{M\_n}$, may be dynamically and/or adaptively variable. The start of each step is triggered by completion of the previous step. The comparator 406 is operable to generate the comparator output valid signal, $V_{cov}$, which provides an indication completion of the decision for each step executed by the comparator 406. Once the comparator output valid signal, $V_{cov}$, is active or asserted, the search and decode logic module 408 is triggered and captures the comparator output voltage signal or code, $V_{comp}$, which is generated by the comparator 406. In this regard, the decode and binary search logic module 408 as well as the DAC code word are triggered when the comparator output valid signal, $V_{cov}$, is active or asserted. In an alternate embodiment of the invention, the timer module 412 may be operable to generate a timeout signal that preempts the comparator output valid signal, $V_{cov}$, and forces a preemptive decision.

In accordance with various embodiments of the invention, the timer module 412 may be operable to measure and/or estimate the time required for each comparator step, namely, the comparator decision time, $t_{M\_n}$. Once the comparator decision time, $t_{M\_n}$ has elapsed, the timer module 412 may be operable to trigger a preemptive decision where one or more remaining code word bits are set to a particular value based on the time required for the comparator 406 to arrive at a decision.

With regard to the preemptive decision, the precise comparator decision time, $t_{M\_n}$, which may be required for the comparator 408 to make a decision may be utilized to set a certain number of subsequent DAC codeword bits. In general, the longer the comparator step, the closer the analog voltage, $V_{dac}$, from the DAC 410, should be to the analog input voltage, $V_{in}$. In instances when the comparator step has taken a sufficiently long time to indicate that $|V_{in}-V_{dac}|$ is less than approximately half the size of the current DAC step size, the value of the next bit, may be inferred depending on the sign of $(V_{in}-V_{dac})$. In instances when the comparator step has taken a sufficiently long time to indicate that $|V_{in}-V_{dac}|$ is less than a quarter of the size of the current DAC step size, the value of the next two bits may be inferred depending on the sign of $(V_{in}-V_{dac})$. In this manner an arbitrary number of subsequent DAC code word bits may be determined. In instances when the comparator step has taken sufficiently long time to indicate that $|V_{in}-V_{dac}|$ is less than a predetermined DAC bit step size ($N_{ovlp}$), the value of the DAC code word bits up to that bit step size may be inferred. The timer module 412 and/or the search and decode logic module 408 may be operable to determine whether a comparator step has taken a sufficiently long time for a condition to occur. In instances where redundancy is utilized in the DAC 410 by introducing a bit $b_r$ with redundant weighting, preemptive decisions may be made on bits $b_n$ to $b_{r+1}$, where $b_n$ is the current bit in the successive approximation, since the settling time which is set by the time elapsed or timeout signal only permits certainty to within the range provided by the overlapping codes.

In accordance with an exemplary embodiment of the invention, a preemptive decision may be triggered in instances when the timer module 412 determines that a decision time has exceeded a particular threshold value. In this regard, once the timer module 410 determines that the threshold value has been exceeded, the timer module 410 may force the preemptive decision. The threshold value may be chosen in order to guarantee that $|V_{in}-V_{dac}|$ is within a decision range which may be equal to the overlap range. The value of the threshold may be static (fixed), varied dynamically and/or varied adaptively.

Figure 5:
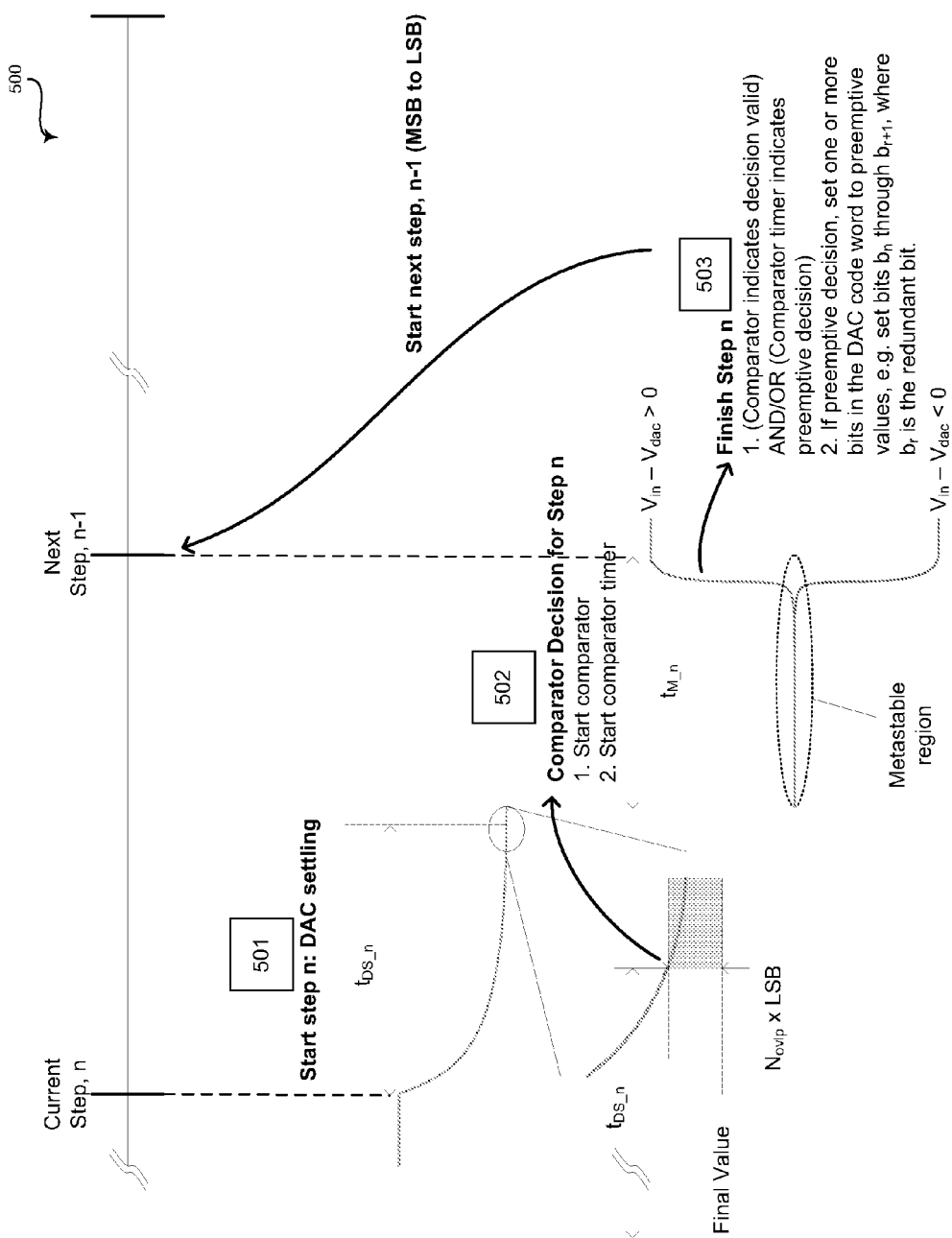
FIG. 5 is a diagram illustrating exemplary operation of an asynchronous successive approximation register ADC, in accordance with an exemplary embodiment of the invention.

FIG. 5 is a diagram illustrating exemplary operation of an asynchronous successive approximation register ADC, in accordance with an exemplary embodiment of the invention. Referring to FIG. 5, the reference numerals 501, 502 and 503 illustrates a timeline for a sequence of the exemplary steps.

The reference 501 represents the settling time for the DAC 410. At 501, step n is started and time $t_{DS\_n}$ is allocated for the DAC 410 to settle within the least significant bit (LSB) of the input voltage, $V_{in}$, to prevent any errors. The time $t_{DS\_n}$ represents the time required for the DAC 410 to settle. The start of each step, n, n−1, and so on (MSB to LSB), is triggered by completion of the previous step.

The reference 502 represents the comparator decision step. During the comparator decision step, the comparator 406 is started and the timer module 412 is also started. In this regard, the comparator 406 is started when the comparator output valid signal, $V_{cov}$, becomes active or is asserted. The timer module 412 is started when the search and decode logic 408 generates a start step indicator signal to the timer module 412.

The reference 503 illustrates the finishing of step n. In the finishing of step n, the comparator 406 may indicate a valid decision based on the comparator output valid signal, $V_{cov}$, or the timer module may generate a timeout or time elapsed (TE) signal, which indicates a preemptive decision. The comparator 406 is operable to generate the comparator output valid signal, $V_{cov}$, in order to indicate the completion of each step. In instances where the timer module 412 generates a timeout or time elapsed (TE) signal to force a preemptive decision, one or more bits in the DAC codeword bits may be set to preemptive values. For example, bits $b_n$ through $b_{r+i}$, may be set to preemptive values, where $b_n$ is the current bit in the successive approximation and $b_r$ is the bit with redundant weighting.

Figure 6:
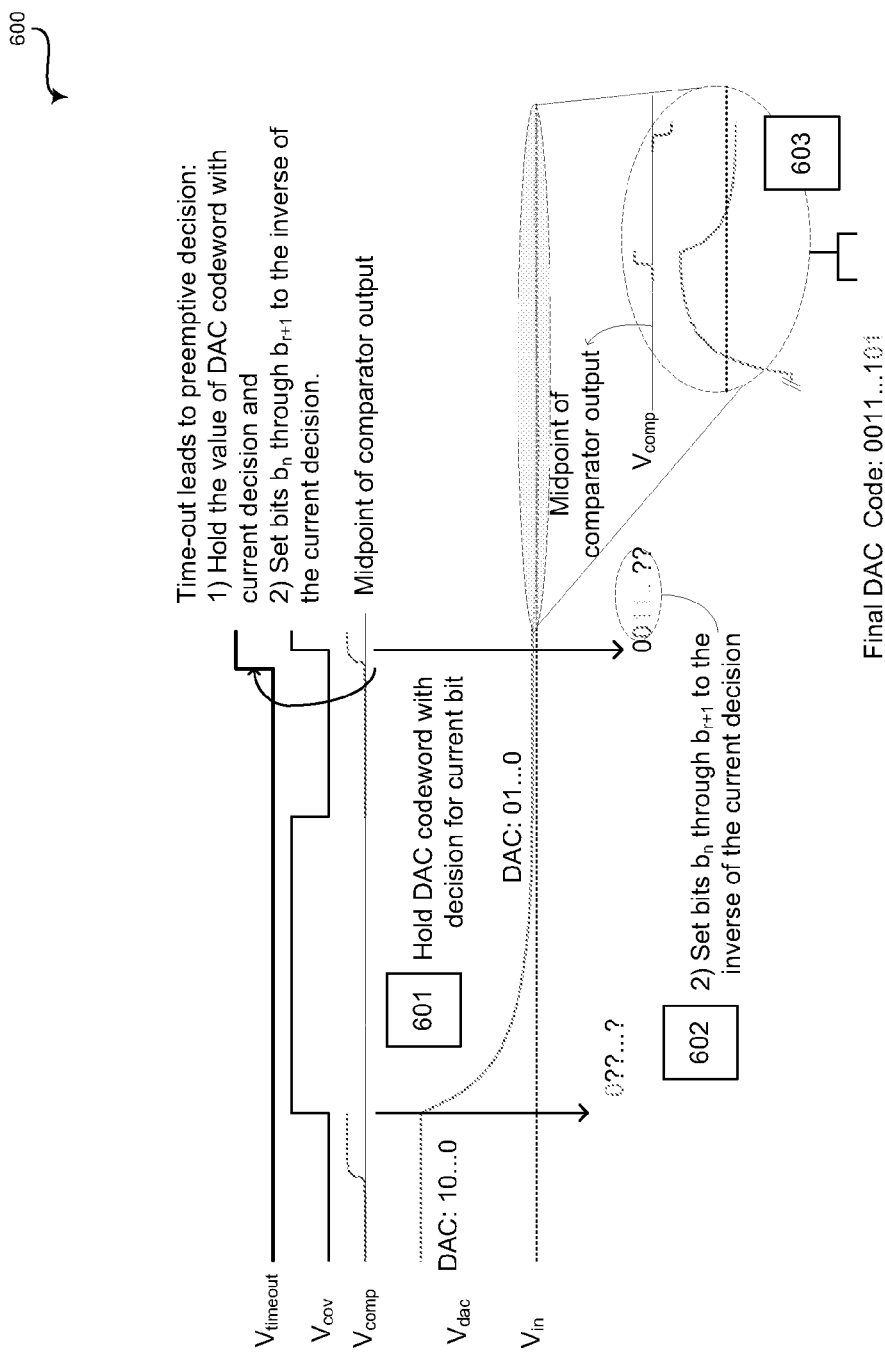
FIG. 6 is a diagram illustrating an exemplary preemptive decision with redundancy for an asynchronous successive approximation register ADC, in accordance with an exemplary embodiment of the invention.

FIG. 6 is a diagram illustrating an exemplary preemptive decision with redundancy for an asynchronous successive approximation register ADC, in accordance with an exemplary embodiment of the invention. Referring to FIG. 6, there is shown a timeout signal, $V_{timeout}$, a comparator output valid signal, $V_{cov}$, a comparator output voltage signal, $V_{comp}$, an analog output DAC voltage, $V_{dac}$, from and an input analog voltage $V_{in}$.

The decode and binary search logic module 408 is triggered when the comparator output valid signal, $V_{cov}$, is asserted or becomes active.

The timeout signal, $V_{timeout}$, may be generated and output by the timing module 412. The timeout signal, $V_{timeout}$, may be substantially similar to the TE or timeout signal generated by the timer module 412.

The comparator output valid signal, $V_{cov}$, may be generated and output by the comparator 406 and is utilized to provide an indication that the output of the comparator is valid.

The comparator output voltage signal, $V_{comp}$, may be generated and output by the comparator 406.

The analog output DAC voltage, $V_{dac}$, may be generated and output by the DAC 410.

Referring to FIG. 5, the comparator 406 generates the comparator output voltage signal, $V_{comp}$, and the comparator output valid signal, $V_{cov}$, becomes active shortly thereafter to indicate that the comparator output voltage signal, $V_{comp}$, is valid. The analog output DAC voltage, $V_{dac}$, represents the DAC code word, 10 . . . 0, for example. The DAC code word with the decision for the current bit is held at 601. After a certain time has elapsed, and no decision was made, the timing module 412 forces a preemptive decision and the timeout signal, $V_{timeout}$, is asserted or becomes active. The value of the DAC codeword with the current decision is held. Since the prior decision was a 0 (0?? . . . ?) and the current decision is a 0 (00? . . . ?), at 602, the remaining bits for the current decision may be set to the inverse of the current decision. Since the current decision is 0, the remaining bits in the DAC code word up to, but not including the redundant bit, are set at 1, which is the inverse of the current decision. The DAC code word now becomes 0011 . . . 1??, where the last overlapping codes are represented by ??. The successive approximation algorithm resumes at bit br and computes the final DAC code word as 0011 . . . 101.

In accordance with an embodiment of the invention, the time reported by the timer module 412 may be mapped along with the voltage difference through computation or by utilizing a look-up table (LUT). The relationship between the comparator decision time and the input voltage difference $|V_{in}-V_{DAC}|$ may be modeled theoretically or empirically and the resulting information may also be incorporated in the look-up table. For example, the relationship between the comparator decision time and the input voltage difference may take into consideration process, voltage and/or temperature (PVT) variations. In this regard, the LUT may be calibrated based on the corresponding process, temperature and supply voltage data.

Since large voltage differences may be readily generated and typically correspond to very short comparator decision times, the generated voltage differences may be applied to the comparator (reusing the DAC) and the corresponding comparator decision time may be measured. This information may be stored in the look-up table. In accordance with an embodiment of the invention, background calibration of the comparator decision time may be done statically, dynamically and/or actively and the corresponding comparator decision times may be stored in the look-up table.

Figure 7:
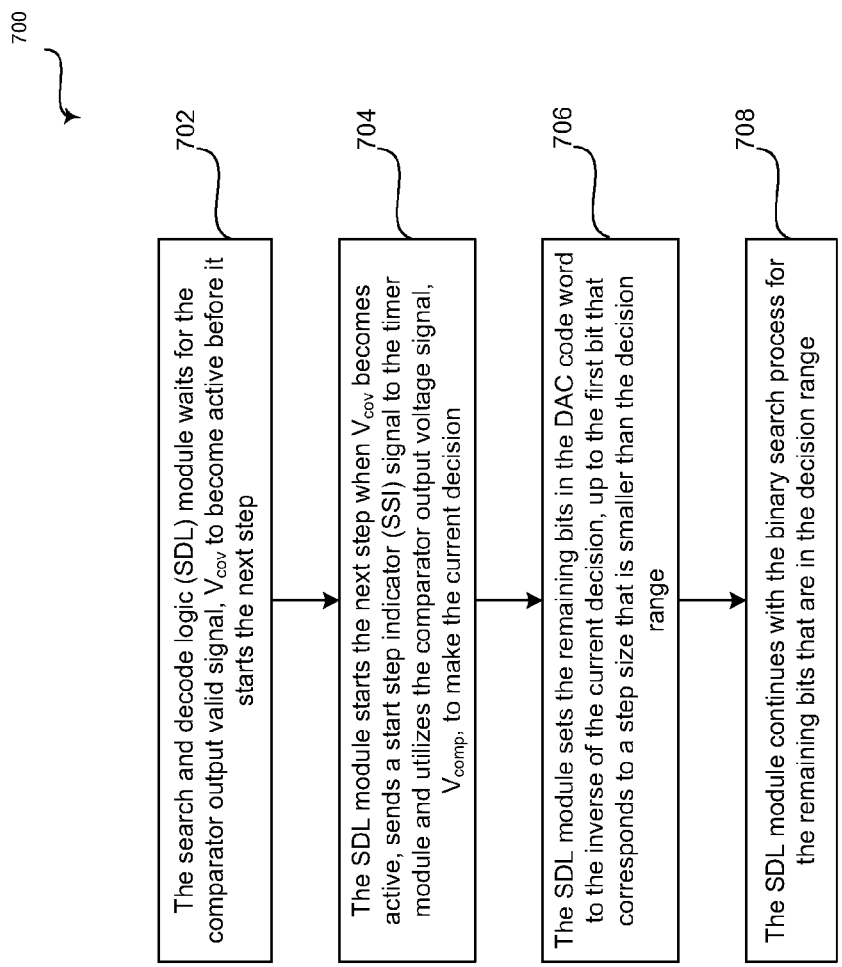
FIG. 7 is a flow chart illustrating an exemplary preemptive decision without timeout, in accordance with an exemplary embodiment of the invention.

FIG. 7 is a flow chart illustrating an exemplary preemptive decision without timeout, in accordance with an exemplary embodiment of the invention. Referring to FIG. 7, there is shown a flow chart 700 comprising exemplary steps 702 through 708. In step 702, the search and decode logic (SDL) module waits for the comparator output valid signal, $V_{cov}$, to become active before it starts the next step. In 704, the search and decode logic module starts the next step when the comparator output valid signal, $V_{cov}$, becomes active, sends a start step indicator (SSI) signal to the timer module, and utilizes the comparator output voltage signal, $V_{comp}$, to make the current decision. In step 706, the search and decode logic module sets the remaining bits in the DAC code word to the inverse of the current decision, up to the first bit that corresponds to a step size that is smaller than the decision range. In step 708, the search and decode logic module continues with the binary search process for the remaining bits that are in the decision range.

Figure 8:
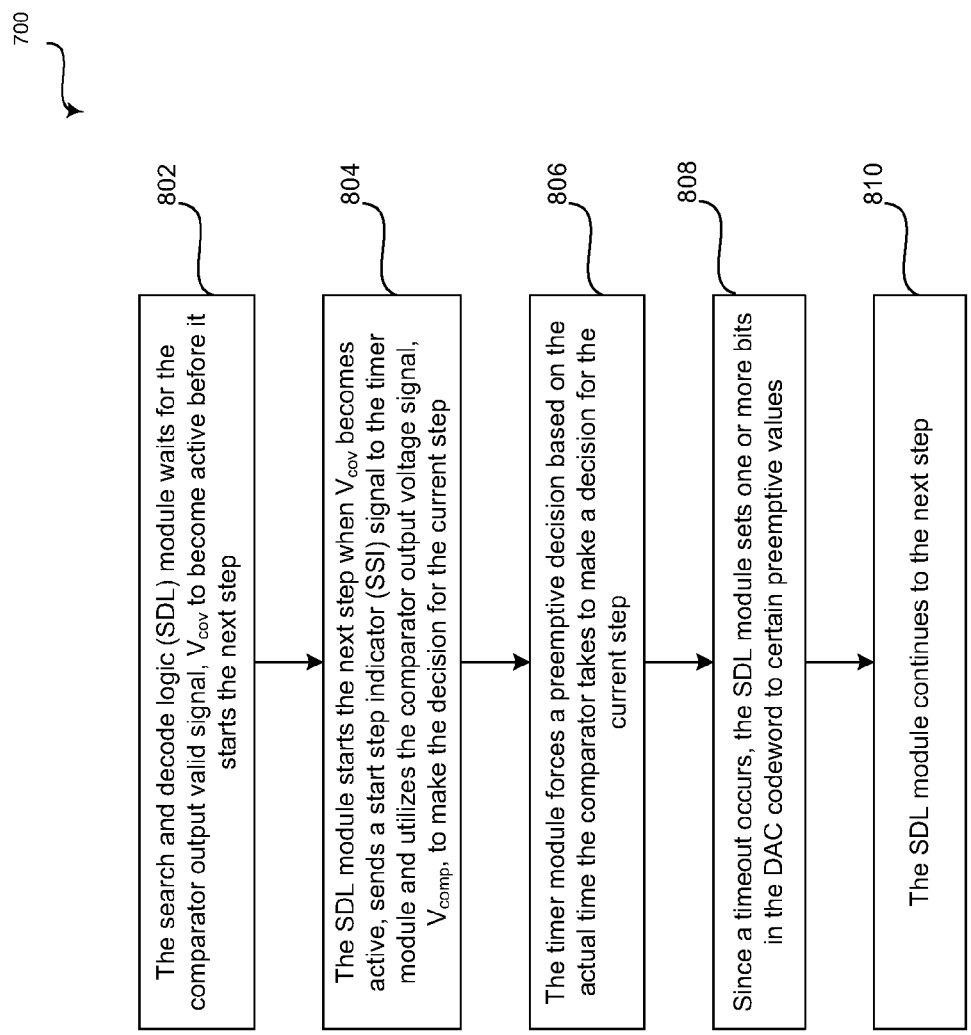
FIG. 8 is a flow chart illustrating an exemplary preemptive decision with timeout, in accordance with an exemplary embodiment of the invention.

FIG. 8 is a flow chart illustrating an exemplary preemptive decision with timeout, in accordance with an exemplary embodiment of the invention. Referring to FIG. 8, there is shown a flow chart 800 comprising exemplary steps 802 through 810. In step 802, the search and decode logic (SDL) module waits for the comparator output valid signal, $V_{cov}$, to become active before it starts the next step. In step 804, the search and decode logic module starts the next step when the comparator output valid signal, $V_{cov}$, becomes active, sends a start step indicator (SSI) signal to the timer module and utilizes the comparator output voltage signal, $V_{comp}$, to make the decision for the current step. In step 806, the timer module forces a preemptive decision based on the actual time the comparator takes to make a decision for the current step. In step 808, since a timeout occurs, the SDL module sets one or more bits in the DAC codeword to certain preemptive values. In step 810, the SDL module continues to the next step.

In accordance with various exemplary embodiments of the invention, an asynchronous successive approximation register analog-to-digital converter 400, which utilizes one or more overlapping redundant bits in each digital-to-analog converter (DAC) code word, is operable to generate an indication signal, $V_{cov}$, which indicates completion of each comparison step and indicates that an output decision for the each comparison step is valid. A timer such as the timer module 412 may be initiated based on the generated indication signal, $V_{cov}$. A timeout signal, $V_{timeout}$, may be generated that preempts the indication signal, $V_{cov}$, and forces a preemptive decision.

The preemptive decision may be operable to set one or more remaining bits up to, but not including, the one or more overlapping redundant bits in a corresponding digital-to-analog converter code word for a current comparison step to a particular value. In an exemplary embodiment of the invention, the one or more remaining bits up to, but not including, the one or more overlapping redundant bits in the corresponding digital-to-analog converter code word for the current comparison step may be set to a value derived from a value of a bit that was determined in an immediately preceding decision.

The timeout signal, $V_{timeout}$, may be generated based on a dynamically and/or adaptively determined threshold time. The determined threshold time may be determined so that it guarantees that a magnitude of a difference between an analog input voltage to the asynchronous SAR ADC, $V_{in}$, and an analog output DAC voltage, $V_{dac}$, is within an overlapping range of voltages corresponding to the one or more overlapping redundant bits. For each comparison step, an analog input voltage to the asynchronous SAR ADC, $V_{in}$, may be compared to an analog output digital-to-analog converter voltage, $V_{dac}$. A corresponding comparing time for the each comparison step may be mapped to the difference between the analog input voltage to the asynchronous SAR ADC, $V_{in}$, and the analog output DAC voltage, $V_{dac}$. Results from the mapping may be calibrated based on process, temperature and/or the analog input voltage to the asynchronous SAR ADC, $V_{in}$, variations. The results from the mapping and results from the calibrating may be stored, for example, in a look-up-table. A particular value for a next bit may be inferred in instances where the corresponding comparing time for each comparison step exceeds a particular time, which provides an indication that a magnitude of a difference between the analog input voltage to the asynchronous SAR ADC, $V_{in}$, and the analog output DAC voltage, $V_{dac}$, is less than a fractional portion of a current step size of a DAC that generates the analog output DAC voltage. Exemplary fractional portions may comprise ½, ¼, ⅛, 1/16, 1/32 and so on.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more line(s) of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Throughout this disclosure, the use of the terms dynamically and/or adaptively with respect to an operation means that, for example, parameters for, configurations for and/or execution of the operation may be configured or reconfigured during run-time (e.g., in, or near, real-time) based on newly received or updated information or data. For example, an operation within a transmitter and/or a receiver may be configured or reconfigured based on, for example, current, recently received and/or updated signals, information and/or data.

Other embodiments of the invention may provide a computer readable device and/or a non-transitory computer readable medium, and/or a machine readable device and/or a non-transitory machine readable medium, having stored thereon, a machine code and/or a computer program having at least one code section executable by a machine and/or a computer, thereby causing the machine and/or computer to perform the steps as described herein for asynchronous successive approximation register (SAR) analog-to-digital converters.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An analog-to-digital converter (ADC), comprising:
a comparator comprising an analog input, a reference input, a preemption input, a codeword output, and a validation output, a codeword on the codeword output of the comparator comprising one or more overlapping redundant bits, wherein if a preemption is indicated at the preemption input, the validation output is set to indicate the preemption and one or more bits of the codeword are set to a particular value, and wherein if a preemption is not indicated at the preemption input, the validation output is set to indicate a valid decision and one or more bits of the codeword are set according to a comparison between the analog input and the reference input;
a digital-to-analog converter (DAC) comprising a codeword input and a reference output, wherein the reference output of the DAC is operably coupled to the reference input of the comparator and the codeword input of the DAC is operably coupled to the codeword output of the comparator; and
a timer operable to set a preemption output in time according to a validation input, wherein the validation input of the timer is operably coupled to the validation output of the comparator and the preemption output of the timer is operably coupled to the preemption input of the comparator.

2. The ADC according to claim 1, wherein the comparator is operable to determine one or more bits of the codeword according to one or more comparisons.

3. The ADC according to claim 1, wherein the comparator is operable to set one or more least significant bits of the codeword up to, but not including, the one or more overlapping redundant bits in the codeword for a current comparison, the one or more least significant bits being set to a value derived from a value of a bit that was determined in an immediately preceding comparison.

4. The ADC according to claim 1, wherein the timer is operable to indicate a preemption at the preemption output based on a adaptively-determined threshold time.

5. The ADC according to claim 4, wherein the adaptively-determined threshold time is determined according to a time required for a difference between the analog input and the reference input to be less that a predetermined threshold.

6. The ADC according to claim 5, wherein the predetermined threshold is based on the one or more overlapping redundant bits.

7. The ADC according to claim 5, wherein the comparator is operable to map a comparing time for each comparison to a difference between the analog input and the reference input.

8. The ADC according to claim 7, wherein the comparator is operable to calibrate results from the mapping based on process, temperature and/or variations in the analog input.

9. The ADC according to claim 8, wherein the comparator is operable to store the results from the mapping and results from the calibrating.

10. The ADC according to claim 7, wherein the DAC is operable to set a particular value for a next bit if the comparing time of each comparison exceeds a particular time.

11. A method, comprising:
comparing an analog signal to a reference signal to determine one or more bits of a codeword, the codeword on the codeword comprising one or more overlapping redundant bits;
if a preemption is indicated, a validation signal is set to indicate the preemption and one or more bits of the codeword are set to a particular value;
if a preemption is not indicated, the validation signal is set to indicate a valid decision and one or more bits of the codeword are set according to the comparison between the analog input and the reference input;
generating the reference signal according to the codeword using a digital-to-analog converter (DAC); and
setting the preemption according to a timer and the validation signal.

12. The method according to claim 11, wherein the method is performed iteratively.

13. The method according to claim 12, wherein the method comprises determining one or more least significant bits of the codeword up to, but not including, the one or more overlapping redundant bits in the codeword for a current iteration, the one or more least significant bits being set to a value derived from a value of a bit that was determined in an immediately preceding iteration.

14. The method according to claim 11, wherein the method comprises indicating a preemption based on a adaptively-determined threshold time.

15. The method according to claim 14, wherein the method comprises determining the adaptively-determined threshold time according to a time required for a difference between the analog input and the reference input to be less that a predetermined threshold.

16. The method according to claim 15, wherein the predetermined threshold is based on the one or more overlapping redundant bits.

17. The method according to claim 15, wherein the method comprises mapping a comparing time for each comparison to a difference between the analog input and the reference input.

18. The method according to claim 17, wherein the method comprises calibrating results from the mapping based on process, temperature and/or variations in the analog input.

19. The method according to claim 18, wherein the method comprises storing the results from the mapping and results from the calibrating.

20. The method according to claim 17, wherein the method comprises setting a particular value for a next bit if the comparing time of each comparison exceeds a particular time.

* * * * *